United States Patent [19]
Lauterbur et al.

[11] Patent Number: 5,532,006
[45] Date of Patent: Jul. 2, 1996

[54] MAGNETIC GELS WHICH CHANGE VOLUME IN RESPONSE TO VOLTAGE CHANGES FOR MRI

[75] Inventors: Paul C. Lauterbur, Urbana, Ill.; Shachar Frank, Hertslia, Israel

[73] Assignee: The Board of Trustees of the University of Illinois, Urbana, Ill.

[21] Appl. No.: 51,965

[22] Filed: Apr. 23, 1993

[51] Int. Cl.$^6$ ..................................................... A61B 5/055
[52] U.S. Cl. ........................ 424/9.322; 424/646; 424/648; 436/173
[58] Field of Search ........................... 424/9, 648, 9.322; 436/173, 806; 128/653.4; 514/836

[56] References Cited

U.S. PATENT DOCUMENTS

| | | | |
|---|---|---|---|
| 4,452,773 | 6/1984 | Molday | 424/1.1 |
| 4,729,892 | 3/1988 | Beall | 424/9 |
| 4,735,796 | 4/1988 | Gordon | 424/9 |
| 4,916,170 | 4/1990 | Nambu et al. | 523/137 |
| 4,965,007 | 10/1990 | Yudelson | 252/65.53 |
| 4,972,837 | 11/1990 | Engelstad et al. | 128/654 |
| 4,985,233 | 1/1991 | Klaveness et al. | 424/9 |
| 4,986,980 | 1/1991 | Jacobsen | 424/9 |
| 5,102,652 | 4/1992 | Groman et al. | 424/9 |
| 5,128,121 | 7/1992 | Berg et al. | 424/9 |
| 5,160,726 | 11/1993 | Josephson et al. | 424/9 |
| 5,262,176 | 11/1993 | Palmacci et al. | 424/9 |
| 5,358,702 | 10/1994 | Unger | 424/9 |

FOREIGN PATENT DOCUMENTS

| | | |
|---|---|---|
| 91/03200 | 3/1991 | WIPO. |
| 92/08725 | 5/1992 | WIPO. |

OTHER PUBLICATIONS

Pouliquen et al., "Iron Oxide Nanoparticles For Use as an MRI Contrast Agent: Pharmacokinetics and Metabolism", Magnetic Resonance Imaging, vol. 9, pp.275–283 (1991).
Hirose et al., "Phase Transition of Submicron Gel Beads", Macromolecules, vol. 20, pp. 1342–1344 (1987).
Matsuo et al., "Kinetics of Discontinuous Volume–Phase Transition of Gels", J. Chem. Phys., vol. 89(3), pp. 1695–1703 (1988).
Kishi et al., "Reversible Volume Change of Microparticles in an Electric Field", J. Chem. Soc., Faraday Trans. 1, vol. 85(3), pp. 655–662 (1989).
Osada et al., "A Polymer Gel with Electrically Driven Motility", Nature, vol. 355, pp. 242–244 (1992).
Kajiwara et al., "Synthetic Gels on the Move", Nature, vol. 355, pp. 208–209 (1992).
Kwon et al., "Electrically Erodible Polymer Gel for Controlled Release of Drugs", Nature, vol. 354, pp. 291–293 (1991).
Hirotsu et al., "Volume–Phase Transitions of Ionized N–isopropylacrylamide Gels", J. Chem. Phys., vol. 87(2), pp. 1392–1395 (1987).
Suzuki et al., "Phase Transition in Polymer Gels Induced by Visible Light", Nature, vol. 346, pp. 345–347 (1990).
Mendelson et al., "Comparison of Agarose and Cross–Linked Protein Gels as Magnetic Resonance Imaging Phantoms", Magnetic Resonance Imaging, vol. 9, pp. 975–978 (1991).
Muller et al., "Transverse Relaxivity of Particulate MRI Contrast Media: from Theories to Experiments", Magnetic Resonance in Medicine, vol. 22, pp. 178–182 (1991).
Ohgushi et al., "Dextran–Magnetite: A New Relaxation Reagent and Its Application to $T_2$ Measurements in Gel Systems", Journal of Magnetic Resonance, vol. 29, pp. 599–601 (1978).
Kokufata et al., "Saccharide–Sensitive Phase Transition of a Lectin–Loaded Gel", Nature, vol. 351, pp. 302–304 (1991).
Nanavati et al., "The Secretory Granule Matrix: A Fast–Acting Smart Polymer", Science, vol. 259, pp. 963–965 (1993).
Osada et al., "Intelligent Gels", Scientific American, pp. 82–87 (1993).

*Primary Examiner*—Gary E. Hollinden
*Attorney, Agent, or Firm*—Scully, Scott, Murphy & Presser

[57] ABSTRACT

Disclosed are compositions useful in nuclear magnetic resonance imaging comprising a matrix which exhibits a volume phase change in response to an electric field, the matrix containing a magnetic and preferably superparamagnetic component distributed therethrough.

28 Claims, 4 Drawing Sheets

MAGNETIC GELS WHICH CHANGE VOLUME IN RESPONSE TO VOLTAGE CHANGES FOR MRI

This invention was supported in part by Grant/Contract No. 89-20133COOP awarded by the National Science Foundation and Grant/Contract No. P41-RR-05964 awarded by the National Institutes of Health. The Government may have certain rights in this invention.

BACKGROUND OF THE INVENTION

This invention relates to diagnostic nuclear magnetic resonance ("NMR") imaging.

Magnetic resonance imaging ("MRI") has become an important tool in biomedical research and non-invasive medical diagnosis. It was first introduced by Lauterbur in 1973 and has developed considerably in the last decade to the point now that it is widely used for clinical imaging of humans in addition to being a powerful research tool.

The image contrast mechanisms of MRI are different from X-ray imaging and provide substantial contrast between certain soft tissues that are nearly identical using conventional radiological techniques. In MRI, the imaged spin is conventionally that of the proton. Most of the signal intensity comes from the most abundant proton in tissues, the water protons. MRI contrast (between image and background, and between images of adjacent tissues) usually relies on differences in the proton density, the transverse relaxation time (the time for recovery of the magnetization from a non-equilibrium state to its equilibrium value in the transverse x-y plane, also known as "$T_2$"), and the longitudinal relaxation time (the time for recovery of the magnetization from the non-equilibrium state to its equilibrium value in the external magnetic field's direction, also known as "$T_1$").

While some soft tissues provide substantial contrast using MRI techniques, others yield a relatively low level of contrast. This has prompted the development of suitable MRI contrast-enhancing agents. Thus, the utility of NMR imaging in diagnostic medicine has been improved by the development of contrast agents which change the relaxation times of water protons in the vicinity of the agent. When the NMR contrast agent is sufficiently proximal to the component of body tissue under study, the agent decreases the relaxation times $T_1$ and/or $T_2$ of water protons in the vicinity of the tissue. Another way this is often expressed is to say that the agent increases the relaxivity, that is, it increases the relaxation rate (time and rate being inversely proportional). In this way, the NMR signal from the tissue of interest is enhanced relative to the background and to the surrounding tissues.

It would also be desirable to have an agent which would mediate changes in $T_1$ or $T_2$ in response to an electric field associated with physiological activity (or to a change in such a field), such as the membrane potential (or changes in membrane potential) associated with e.g. cellular membranes or neurons. Such an agent would permit MRI to be applied to the non-invasive study and diagnosis of bodily processes which involve such potentials. An agent having such capability has not heretofore been known, however.

The present invention relates more specifically to diagnostic agents containing a magnetic metal component, which agents are useful in magnetic resonance imaging. The agents of the present invention are useful in enhancing the contrast in conventional MRI. In addition, the agents of the present invention are useful in providing and enhancing contrast between potential states of a tissue which emanates, or which is capable of emanating, an electromagnetic field. For instance, as described more fully below, the agents would be responsive to cellular membrane potentials and changes in membrane potential.

SUMMARY OF THE INVENTION

One aspect of the invention is a diagnostic agent comprising a matrix whose specific volume undergoes a change from a first value to a second value in response to an electric field, said matrix further comprising a magnetic component distributed therethrough.

Another aspect of the present invention comprises a method of imaging a human or non-human animal body or a selected region thereof, which method comprises administering to the body or to the selected region thereof a diagnostically effective amount of a diagnostic agent comprising a matrix whose specific volume undergoes a change from a first value to a second value in response to an electric field, said matrix further comprising a magnetic component distributed therethrough, and generating a nuclear magnetic resonance image of said body or said region.

DETAILED DESCRIPTION OF THE INVENTION

The diagnostic agents of the present invention generally comprise a hydratable solid, water-soluble or water-insoluble matrix permeable to ion flow therethrough when hydrated, throughout which is distributed magnetic species.

One distinguishing and significant characteristic of the matrix is its capability to exhibit an increase or decrease in specific volume (defined as volume per unit mass of material) when brought into proximity with an electric field. Preferably, the matrix is susceptible to such a change in specific volume in response to electric fields on the order of those encountered in cellular and intracellular membrane potentials, typically on the order of –50 mV.

The changes in specific volume are preferably reversible (i.e. the specific volume detectably increases or decreases upon the application of the electric field, and the specific volume reverts to its original value when the electric field is discontinued) at least over the periods of time encountered in carrying out the MRI technique and in measuring the transverse relaxation times. However, it will be recognized that in some applications in which $T_2$ values are measured, reversibility of the specific volume change is not essential.

The change in specific volume can be discontinuous (in the sense that as an electrical field is applied and its strength gradually increased, a plot of the specific volume against field strength would show a change in slope associated with the change from the first value of specific volume to the second value), but need not be discontinuous. The change is properly termed a volume phase transition.

Exemplary of matrix materials which undergo such a change in specific volume in response to an electric field are polymeric gels, or polyelectrolyte gels. Polymeric gels generally comprise solid, cross-linked polymer networks capable of forming a stable system in equilibrium with an interpenetrating liquid, typically water. A polyelectrolyte gel is a solid, cross-linked polymer bearing a large number of ionizable groups and which is capable of forming an equilibrium hydrated system with an interpenetrating aqueous solution of counterions.

For a gel to undergo a volume phase transition, the gel should be subject to sufficiently large internal osmotic pressure (or negative external osmotic pressure) and the solvent used for the gel should be poor. Such a positive internal osmotic pressure can be created by ionizing the polymer network, and originates from the counterions trapped inside the gel. Incorporation of ionizable groups onto the network drives the transition to being discontinuous. The degree of specific volume change varies with the degree of ionization of the gel and may be as large as 500-fold or 1,000-fold.

Suitable gels include polymers and copolymers based on monomers containing ionizable groups. Such monomers include acrylic acid, methacrylic acid, vinyl sulfonic acid, styrene sulfonic acid (particularly p-styrene sulfonic acid), maleic acid, butenoic acid, vinyl phosphate, vinyl phosphonate, and the like. Gels are made by homopolymerizing or copolymerizing any of the foregoing monomers, or copolymerizing any of the foregoing with another non-ionizable monomer such as ethylene, propylene, styrene, vinyl methyl ether, vinyl acetate, vinyl alcohol, acrylonitrile, acrylamide, N-($C_1$-$C_6$ alkyl) acrylamide (such as N-isopropylacrylamide), and the like. Other suitable gel materials would include agarose and cross-linked bovine serum albumin.

As is evident from the Examples herein, the gel matrix can be a copolymer as described above into which has been incorporated as one comonomeric component a ligand that connects to, complexes or physically entraps the desired magnetic species.

The gel is preferably cross-linked sufficiently to let it take a physically stable form when hydrated or dehydrated. Suitable cross-linking can be provided by incorporating about 0.5 wt. % to about 1.5 wt. % of a crosslinking agent into the matrix. A preferred cross-linking agent is N,N'-methylene bis(acrylamide).

While the mechanism by which a gel undergoes a volume phase change in response to an electric field is not completely understood, it appears the change relies on the diffusion of ions into and out of the matrix, and more particularly on the replacement of larger cations within the matrix by protons. Thus, the conditions can readily be established under which a particular polymeric or copolymeric system should be prepared so as to undergo the volume phase transition as described herein, given the description herein of the desired properties of the matrix and of the assumed mechanism of the change in specific volume.

By "magnetic" materials is preferably meant materials that are superparamagnetic. As is the conventional understanding given that term, superparamagnetic materials exhibit magnetic properties only when in an externally applied magnetic field, and otherwise exhibit essentially no magnetic properties; and their total magnetism is greater than the sum of that of the individual particles considered separately. If the particle size is sufficiently small, the magnetic material will be superparamagnetic. The following description will be directed to superparamagnetic materials, but it should be understood as being illustrative as well with respect to other magnetic materials that may be useful in this invention.

The superparamagnetic materials present in the novel diagnostic agents of the present invention are preferably selected from the group of elements having atomic numbers 21–29, 42, 44, and 57–70, elements having atomic numbers 24–29 or 62–69 being especially preferred. Examples of suitable elements include iron, which is the most preferred, manganese, nickel, chromium and copper. Examples of suitable lanthanides include gadolinium, europium, dysprosium, holmium and erbium. The superparamagnetic species is preferably present in ionic form, typically as the oxide. The most preferred superparamagnetic species are iron oxides, such as magnetite ($Fe_3O_4$) or maghemite (—$Fe_2O_3$).

The superparamagnetic species should be sufficiently immobilized in the matrix so that during any magnetic resonance analysis it cannot be removed therefrom by dissolution or chemical reaction that would be encountered, even as a result of a change in the specific volume of the matrix. Thus, the superparamagnetic material can be simply physically entrapped within a polymeric matrix, or it can be chemically bound into the matrix or complexed, encased in, or physically immobilized by an intermediate ligand which is in turn, chemically bound into the matrix.

The superparamagnetic metal can for example be bound to the matrix by carrying out the polymerization which forms the matrix in the presence of chelate-forming groups and then reacting this intermediate with an excess of a water soluble salt of the metal in aqueous solution at an appropriate pH-value, usually 2–7, e.g. 5–6.

If desired, a bridging group can be introduced between the chelate-forming groups and the matrix backbone, e.g. in a manner known per se.

In an alternative embodiment of the invention the superparamagnetic metal species may be present in cavities within the matrix, in the form of an insoluble or sparingly soluble substance or composition. The incorporation of the superparamagnetic metal species within the matrix can be achieved in several ways.

In one method dry or incompletely water-swollen particles of a swellable matrix material may be swelled in a solution, preferably an aqueous solution, of a salt of the superparamagnetic metal, for instance the chloride of said metal whereafter the particles are dried. The particles are then swelled again in a solution, preferably an aqueous solution, of a substance which is capable of precipitating the metal in the form of an insoluble or sparingly soluble material, compound or complex. For instance the precipitating substance may be a soluble phosphate, such as sodium phosphate, when the phosphate of the superparamagnetic metal is insoluble or sparingly soluble in the medium in which the particles are swelled. Alternatively, the precipitating substance may be an alkali metal hydroxide when the hydroxide of the superparamagnetic metal is insoluble or sparingly soluble in the medium in which the particles are swelled.

According to another method, dry or incompletely water swollen particles of a matrix material are swelled in a solution comprising a solvent in which the particles swell, e.g. water or dimethylsulfoxide, and one or more reagents of which at least one comprises the superparamagnetic metal species in a suitable chemical form, and which reagents (optionally in contact with the matrix) produce by a chemical reaction (which may involve the matrix), for example a redox process, the metal species in elemental state or in the state of an insoluble or sparingly soluble chemical compound containing the metal, said metal or compound being finely dispersed in the cavities of the matrix.

According to another method the matrix is prepared by a process involving a cross-linking reaction carried out in a medium in which microparticles of the superparamagnetic metal or a compound or complex thereof are dispersed, said compound or complex being insoluble or sparingly soluble in said medium. Thus, the superparamagnetic metal species will become entrapped in a very finely dispersed form in cavities formed in the three-dimensional network of the particles of the matrix.

Where the superparamagnetic metal species is incorporated as a complex, this is preferably a chelate complex which is insoluble or sparingly soluble in aqueous media.

Preferably such a chelate complex comprises at least two 5- or 6-membered rings comprising the metal, especially four to eight 5- or 6-membered rings. Such 5- and 6-membered rings comprise the metal and two metal-coordinating atoms, separated from each other by two or three atoms respectively. One of the metal-coordinating atoms is preferably a nitrogen atom and the other a nitrogen atom, a sulphur atom or an oxygen atoms. The nitrogen atoms can, for instance, be the nitrogen atoms in an amino, imino or nitrile group. The sulphur atoms can, for instance, be the sulphur atoms in a mercapto, thioether or thiono group. The oxygen atoms can, for instance, be the oxygen atoms in a carboxylate, sulphonate, sulphate, keto, phosphonate, phosphate, nitrate, hydroxyl or ether group. The metal coordinating atoms are members of chelate-forming groups which preferably contain at least two sequences, which may be equal or different, which in addition to the metal-coordinating atoms preferably contain 2 or 3 carbon atoms (in the case of 5- and 6-membered rings respectively) in the chelate complex, one of the carbon atoms optionally being replaced by an oxygen, sulphur or nitrogen atom.

The diagnostic agent can be obtained in the form of particles either by preparing the polymerisates in the form of larger pieces (bulk polymerization) and then disintegrating said pieces, for instance by grinding, or by directly preparing the product in the form of smaller, preferably spheroidal, particles (beads) by dispersion, emulsion or reverse emulsion polymerization. Particles of the desired size range can be isolated by fractionation of the product, e.g. by sieving.

The matrix particle size chosen for the diagnostic agent will vary depending on the particular use intended for the diagnostic agent. In general, however, the particles in their water-swollen state will have a size within the range 0.01–1000 microns, preferably within the range of 0.1–100 microns. In this connection, particles having a particle size within the range 0.01–5 microns such as e.g. within the range of 0.1–3 microns, are considered small, whereas particles having particle size exceeding 5 microns, for instance having a particle size within the range 5–100 microns, are considered large. For parenteral use small particles, preferably particles having a particle size less than 3 microns, should be used where it is intended that the particles should be able to pass blood capillaries without causing obstruction. For diagnostic agents intended for administration to body cavities having external escape ducts (e.g. the gastrointestinal tract), particles having a size within a wide range can be used. However, in order to avoid sedimentation of the particles, it is preferred that particles of a size less than 10 microns be used. The increase in the transverse relaxation rate is greatly enhanced with smaller particles.

The diagnostic agent according to the present invention may be in the form of a solution in an aqueous medium or may be in dry form, e.g. in lyophilized form or a powder or tablets, or in capsules, microcapsule or liposomes. For parenteral administration a solution in a sterile physiologically acceptable medium is preferably used, such as an isotonic aqueous solution. For administration to body cavities having external escape ducts (e.g. gastrointestinal tract, the bladder and the uterus), a solution in a physiologically acceptable median optionally containing viscosity-increasing substances may be conveniently be used. The aqueous solutions may be adjusted to the desired pH value by means of a physiologically acceptable buffer. Also other additives conventionally used within the pharmaceutical industry can be added to various different formulations. Examples include flavors, and dyestuffs incorporated in the compositions for oral administration in particular.

The concentration of the superparamagnetic species in the diagnostic agent is somewhat dependent on the form in which the agent is administered, and on the particular organs or tissues to be imaged. Generally, the total dosage will be in the range of $10^{-6}$ to 10, and preferably about $10^{-3}$ to $10^{-1}$, millimoles of paramagnetic metal species per kilogram of body weight. The superparamagnetic species will generally comprise about 0.001 to about 30% by weight of the matrix, and preferably at least about 0.01% by weight and more preferably at least about 0.1% by weight thereof. Preferably the superparamagnetic species comprises less than about 20% by weight, and more preferably less than about 10% by weight of the matrix.

The concentration of the diagnostic agent in a suspension to be used in MRI diagnosis will generally be higher than 0.01 percent by weight, for instance higher than 0.1 percent by weight, for example higher than 1.0 percent by weight, and lower than 35 percent by weight, for example lower than 25 percent by weight, e.g. lower than 15 percent by weight, calculated on the total weight of the suspension. For example, the concentration may conveniently be within the range 0.110 percent by weight, calculated as the dry weight of the matrix in the total weight of the suspension.

The agent is selected for high stability, low toxicity, high in vivo relaxivity, and high uptake in the particular target tissue. Dosage depends on the sensitivity of the NMR imaging instrumentation, as well as on the composition of the contrast agent. Preferably, for example, the agent is administered intravenously in a dosage range from about 1–500 µmol/kg.

Following administration of the contrast agent, conventional NMR imaging can be carried out. Alternatively, $T_1$ and/or $T_2$ values can be determined, without generation of an image. Pulse sequence (inversion recovery, IR; spin echo, SE) and imaging parameter values (echo time, TE; inversion time, TI; repitition time, TR) are selected according to the diagnostic information sought. In general, if a $T_1$-weighted image is preferred, TE preferably is less than 300 milliseconds (or the minimum value) to maximize $T_1$-weighting. Conversely, if a $T_2$-weighted image is desired, then TE should be greater than 30 milliseconds to minimize competing $T_1$ effects. TI and TR will remain approximately the same for both $T_1$- and $T_2$-weighted images; TI and TR are generally on the order of about 200–600 and 100–1000 milliseconds, respectively.

Thus, the diagnostic agents of the present invention can be used in a method which comprises administering to the body, or to selected regions thereof, the indicated effective amounts of the agent. The agent can be injected directly into the vicinity of the body to be imaged, or it can be intravenously or gastrointestinally administered, or it can be applied topically to the body in the vicinity of the region to be imaged. Then, a magnetic resonance image of the body or of the indicated region is obtained using conventional magnetic resonance imaging equipment and techniques. The image thus produced by that equipment can optionally be fixed in hard copy form, in photographic negative or positive form, or stored within a computer memory for subsequent recall onto a screen or for subsequent conversion into hard copy.

Alternatively, the diagnostic agent can be used to obtain $T_1$ and/or $T_2$ values of biological material, such as tissue, cells, and the like, or of non-biologicial material, such as soil, solid objects, porous solids, and the like, by intimately contacting the agent and the material and then measuring the transverse and/or longitudinal relaxation times of the material.

The invention will be described further with reference to the following examples, which are incorporated herein for purposes of illustration and should not be interpreted as limiting the scope of the claims appended hereto.

EXAMPLE 1

Superparamagnetic iron oxide particles, about 0.01–0.12 microns in diameter, consisting of iron oxide particles coated with an equal weight of a copolymer made from 95% styrene and 5% methyl methacrylate, and modified to carry surface carboxylic acid groups, and stabilized with a minor amount of surfactant, were obtained from Polysciences, Warrington, Pa. (as product number 19634). Vinyl glycine (2-amino-3-butenoic acid) (Sigma, St. Louis, Mo., product number V7252), allylglycine (2-amino-4-butenoic acid) (Sigma, product number A8378) or oleyl amine (Aldrich, Milwaukee, Wis., product number 0-780-5) was covalently coupled to the particles by the following method: repeated washing to remove surfactant, activating the carboxylic acid groups by adding carbodiimide, washing out unreacted carbodiimide, then adding the vinylglycine, allylglycine or oleylamine (to react the amine with the surface carboxylic groups on the particles) and leaving the solution to react overnight, then blocking unreacted sites on the surface of the polystyrene particles, and repeatedly washing the particles and then resuspending them in water.

The particle suspension was dried under argon and the dry powder (about 12 mg) was suspended in a round-bottomed flask in 68.5 ml of cyclohexane (analytical grade) and 0.48 g of sorbitan monooleate ("Span 80", Sigma, product number S-7670) (surfactant). To the flask were added 12.79 g of sodium acrylate (Polysciences, product number 01207, or synthesized from sodium methoxide (Aldrich, product number 15,625-6) and acrylic acid (Aldrich, product number 14,723-0)) (monomer), 0.01 g N,N-methylene-bis-acrylamide (Sigma, product number M7229) (cross-linker), and 0.03 g potassium persulfate (Fisher Scientific, Fairlawn, N.J.) (initiator). The mixture was polymerized for 6 hrs. at 60° C. under an argon atmosphere, with constant mechanical stirring at 180–200 rpm. Following this polymerization (inverse emulsion polymerization), the microparticles thus produced were then equilibrated with 100 ml of distilled water for 1 hour washed with 100 ml of cyclohexane on a GF/A glass fiber filter (Whatman), and 4–6 times with methanol and dried in an argon gas stream. The dry precipitate (about 0.05% iron oxide, w/w) was crushed with a mortar and pestle and suspended in 35 ml of distilled water. The resulting magnetic sodium polyacrylate gel microparticles were about 50–200 microns in diameter. They were uniformly brown in color, indicating a uniform distribution of iron oxide particles in the gel. Portions of some batches of particles were homogenized and ultrasonicated to reduce the particle size to about 10–100 microns.

EXAMPLE 2

An aqueous suspension of gel microparticles produced in accordance with Example 1 were then dyed with methylene blue to make them easier to see. A drop of the suspension was placed on a microscope slide which had a thin sheet of rubber glued to it with a square hole in the center to contain the solution. Two parallel platinum wires, separated by 3 mm, were run through the hole in the rubber sheet from side to side. These wires served as electrodes and were connected to a power supply. The slide was viewed under a light microscope at magnifications up to ×100. An electric field of 40 V/cm was applied. The particles shrank in the electric field in a few minutes, with larger particles taking longer. The diameter of a particular particle was observed to decrease by about 36%, from 15.05 microns to 9.68 microns, corresponding to a decrease of about 73% in volume. After the electric field was turned off the particles swelled back to their original size, though more slowly.

EXAMPLE 3

The water proton transverse relaxation time ("$T_2$") of an aqueous suspension of the magnetic gel microparticles made in accordance with Example 1 was measured.

A suspension of the particles was put in a glass, cuvette-like, cell which had gold foil coating the inner sides of two opposite walls of the cell, which were separated by 2.80–4.25 mm. The cell was put inside an 8 cm (i.d.) rf coil in a SISCO 4.7T/33 cm bore spectroscopy imaging system. Cables were attached to the two gold electrodes in the cell and extended to a DC power supply. $T_2$ of the sample was measured using a CPMG pulse sequence with a delay time $\tau$ of 0.003–0.008 s. Each $T_2$ was calculated from 15 echoes (or 10 if $T_2$ was very short) by fitting a single exponential. The evolution of $T_2$ with time with and without an electric field turned on (voltage applied between the electrodes) was followed.

Iron concentrations were measured by microanalysis using the inductively coupled argon plasma emission method.

$T_2$ was measured in this Example and in Example 4 with the CPMG pulse sequence, introduced by Meiboom and Gill, (The Review of Scientific Instruments 29(8), 688–691 (1958)) as an improvement to the Hahn spin echo experiment [Hahn, Physical Review 80(4), 580–594 (1950)]. It reduces the effects of diffusion in an inhomogeneous external magnetic field $B_o$, and decreases the sensitivity of the measurement to errors in the determination of the 180° pulse width. The pulse sequence is the following:

$$[90°_x-\tau-(-180°_y-\tau-\text{echo}-)_n-],$$

with coherent pulses and a 90° phase shift between the 90° pulse and the 180° pulse. The echo amplitude follows the equation $$A(t)=A(t=0)\cdot e^{(-t/T2)}$$

where A is the amplitude of the echo and t is the time when the echo was acquired, measured from the beginning of the pulse sequence.

A train of 10 or 15 echoes (8 in experiments with red blood cells in Example 4) was acquired in a single pulse sequence and the natural logarithms of the amplitudes of the echoes were linearly fitted by a least squares routine (performed by the spectrometer, SISCO or GN300/Libra) producing a slope that was the inverse of the transverse relaxation time, $T_2$, as can be seen in the equation:

$$\ln[A(t)] = \ln[A(t=0)] + -\frac{1}{T_2} \cdot t$$

The results of $T_2$ measurements, according to these methods, of a number of preparations of magnetic polyelectrolyte gel microparticles can be seen in Table I. The rates at which the transverse relaxation rate ($R_2$) increased when the electric field was applied were calculated by fitting the data to an exponential function. Decays of the transverse relaxation rate before the electric field was turned on as well as after it was turned off were also fitted to an exponential function.

Materials prepared as in Example 1 with each of three different connecting units were compared. The connecting units are the groups (i.e., containing a carbon-carbon double bond) that were covalently coupled to the surface of the superparamagnetic iron oxide particles, in order to incorporate them into the polyelectrolyte matrix.

Some of the materials were treated to reduce their size by ultrasonication (for 30 minutes), or by homogenization (with a hand held manual tissue homogenizer), followed by ultrasonication (10 min.), and then mixing with a vortex mixer (2 min.), the complete cycle repeated 4 times. This resulted in smaller particles (~10–100 μm in diameter).

The effect of using a higher electric field was also tested in Run 10. One experiment (Run 5) was performed with the electric field turned on as soon as the sample was inserted into the magnet, to test whether the electric field changed $T_2$ only by opposing the aggregation of the gel microparticles caused by the magnetic field. Most of the samples exhibited such an aggregation when inserted into the magnetic field, indicated by a decay of the transverse relaxation rate.

TABLE I

Summary of changes in the transverse relaxation rates of an aqueous suspension of magnetic polyelectrolyte gel microparticles upon application of an electric field of 36 V/cm (42 V/cm in Run 10)

| Number | Connecting Unit[a] | $AR_2(I)$[c] [%] | $AR_2(II)$[d] [%] | Initial (−) | Rate of increase (+) or decay (−) of $R_2$ [1/min.] | | | |
|---|---|---|---|---|---|---|---|---|
| | | | | | (+) with $E_1$ on[e] | (−) with $E_1$ off[f] | (+) with $E_{11}$ on[g] | (−) with $E_{11}$ off[h] |
| 1 | VG | 16 | 10 | 0.0183 | 0.454 | 0.0274 | 0.0909 | 0.0424 |
| 2 | AG | 12 | 12 | 0.0128 | 0.0893 | 0.0358 | 0.0403 | 0.0382 |
| 3 | AG[b] | 18 | 17 | 0.0141 | 0.0971 | 0.0284 | 0.167 | 0.0226 |
| 4 | AG[i] | 14 | 10 | 0.0126 | 0.0990 | 0.0294 | 0.250 | 0.0185 |
| 5 | AG[j] | 7 | — | 0.0065[j] | 0.104 | 0.0258 | — | 0.0205 |
| 6 | AG | 7 | 5 | 0.0093 | 0.0781 | 0.0098 | 0.0502 | 0.0153 |
| 7 | OA | 6 | 6 | 0.0132 | 0.0625 | 0.0106 | 0.104 | 0.0082 |
| 8 | OA[b] | 9 | 8 | 0.0095 | 0.130 | 0.0123 | 0.169 | 0.0191 |
| 9 | OA | 12 | 13 | no decay | 0.0833 | 0.0078 | 0.0690 | 0.0028 |
| 10 | OA[k] | 15 | — | 0.0130 | 0.101 | 0.0150 | — | — |
| 11 | OA | 14 | 13 | 0.0131 | 0.133 | 0.0201 | 0.118 | 0.0157 |
| 12 | OA[l] | 7 | — | 0.0140 | 0.303 | 0.0087 | — | — |

[a] The chemical molecule connecting the superparamagentic polystyrene particles to the sodium polyacrylate polymer matrix:
VG = vinylglycine: (iron oxide/polystyrene/MMA)-NH—CH(COOH)—CH—CH$_2$—CH$_2$—CH(COONa)-(polymer)
  |
  CH$_2$—CH(COONa)-(polymer)
AG = allylglycine: (iron oxide/polystyrene/MMA)-NH—CH(COOH)—CH$_2$—CH—CH$_2$—CH$_2$—CH(COONa)-(polymer)
  |
  CH$_2$—CH(COONa)-(polymer)
OA = oleylamine: (iron oxide/polystyrene/MMA)-NH—(CH$_2$)$_8$—CH—CH[(CH$_2$)$_7$CH$_3$]—CH$_2$—CH(COONa)-(polymer)
  |
  CH$_2$CH(COONa)-(polymer)

[b] Multiple runs were made with material of a given formula.
[c] The increase in $R_2$ after applying the electric field for the first time.
[d] The increase in $R_2$ after applying the electric field for the second time.
[e] The rate of increase (exponential) of $R_2$ after applying the electric field for the first time.
[f] The rate of decay (exponential) of $R_2$ after switching off the first application of the electric field.
[g] The rate of increase (exponential) of $R_2$ after applying the electric field for the second time.
[h] The rate of decay (exponential) of $R_2$ after switching off the second application of the electric field.
[i] The sample was ultrasonicated.
[j] The electric field was turned on when the sample was inserted into the magnet (i.e., at t = 0).
[k] The electric field used was stronger than that used in other samples (42 V/cm) instead of 36 V/cm).
[l] The sample was homogenized, ultrasonicated, and mixed with a vortex mixer.

The transverse relaxation rate ($T_2^{-1}$) showed an initial decay when samples were inserted into the magnetic field. Application of the electric field caused the relaxation rate to increase. When the electric field was turned off the relaxation rate dropped back toward its earlier level. This electric field-induced increase in transverse relaxation rate was found to occur only with gels that undergo a volume phase transition.

In Run 5, the electric field had already been turned on before the gel suspension was inserted into the magnet. The usual slow decrease in relaxation rate was observed, followed by a much faster rate when the electric field was turned off. An even faster increase in relaxation rate then occurred when the electric field was turned on again. This indicates that the change in $T_2^{-1}$ with a change in the applied electric field is a result of the reversible phase change in specific volume of the magnetic gel microparticles, rather than a result of aggregation and disaggregation of the micro particles.

The sample made with vinylglycine (Run 1) showed a higher rate of increase of $R_2$, as did the samples whose particle sizes had been reduced (Runs 4 and 12) from 50–200 microns to 10–100 microns.

The results of these tests show that the magnetic polyelectrolyte gel microparticles of the present invention do change the transverse relaxation time of a solution when an electric field is applied.

EXAMPLE 4

Magnetic gel micro particles which undergo a specific volume phase transition as a result of a change in the membrane potential of an adjacent biological cell or neuron could be used as voltage-sensitive magnetic resonance monitoring agents in MRI and spectroscopy. Thus, MRI might be used in a new mode, to study electrical phenomena associated with cellular function both in vitro and in vivo.

To examine this, a test was carried out using to advantage the property that red blood cell membranes can be hyperpolarized from about −9 mV to about −66 mV by adding valinomycin (cyclo-[-D-valine-L-lactic acid-L-valine-D-α-hydroxyisovaleric acid]), an ionophore that makes the membrane selectively permeable to potassium.

Blood was drawn from guinea pigs using a heparinized syringe and then washed four times [Marjanovic and Willis, J. Physiology 456, 575–590 (1992)] by centrifuging it (4 minutes at 3000 rpm), discarding the supernatant, and resuspending the cells in a buffer consisting of 146 mM NaCl, 4 mM KCl, 4 mM Tris (2-amino-2-hydroxymethyl-1,3-propanediol) and 4 mM HEPES (N-2-hydroxyethyl-piperazine-N'-2-ethanesulfonic acid), with the pH adjusted to 7.4 (at room temperature). After the final washing, the red blood cells were suspended in the same buffer to reach a concentration of ≈20% (final volume five times the volume of the cells alone).

0.5 ml of the suspension of magnetic gel microparticles were put in a 12 mm NMR tube and 2 ml of the buffer was added, followed by 2.5 ml of the 20% red blood cell suspension. The suspension was mixed well to begin the experiment, i.e., t=0. The resulting suspension had a hematocrit of about 10%.

The NMR tube was inserted into a GN300/Libra (GE/Tecmag) wide bore NMR spectrometer, with a vertical magnet at 7.0 T. $T_2$ values were measured at room temperature by a CPMG pulse sequence as described in Example 3, with a delay time τ of 1.5 ms. Eight echoes were acquired and their amplitudes fitted to a single exponential. The time course of $T_2$ and the effects on it of shimming and shaking the sample were recorded. A change in the potential of the cell membrane was induced by adding 0.5 microliter of a 0.1M valinomycin solution (Sigma, product number V0627) dissolved in DMSO or ethanol (analytical grades), and mixing well. The addition of valinomycin caused the membrane potential of the cells to become hyperpolarized, with a large increase in the resulting electric field across the membrane.

To test for artifacts that may result from settling of the cells and/or particles, the NMR tube was shaken from time to time outside the magnet and then reinserted into the spectrometer. The sample was also shimmed periodically to see if shimming produced any artifacts.

The $T_2$ values obtained were converted to transverse relaxation rates ($1/T_2$) and then divided by the average of the relaxation rates before the addition of valinomycin to normalize them. This procedure facilitates the comparison of results from different experiments since the absolute values of the transverse relaxation rates varied from experiment to experiment. (Hematocrits reported are only approximate, since the final concentration of cells was made by diluting the centrifuged cells to a volume 5 times their own, this dilution being the only means used for estimating the hematocrit.)

Figure 1:
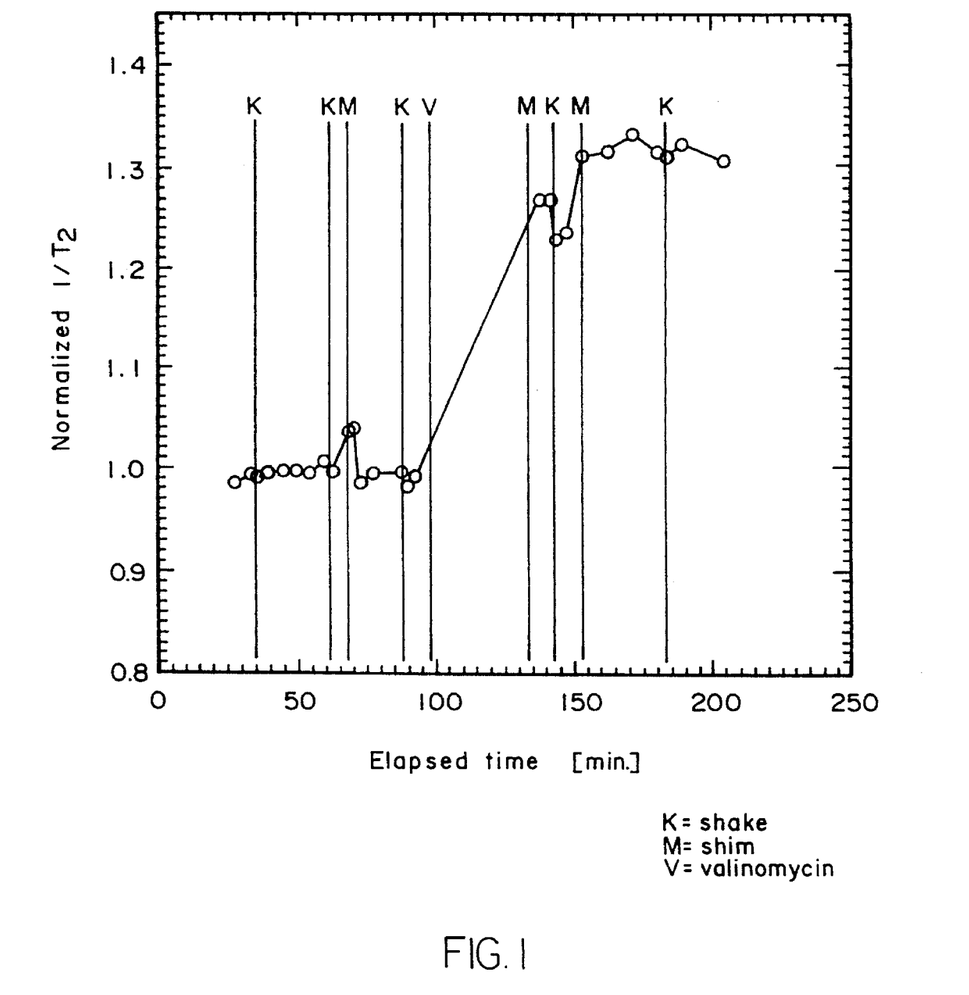
FIGS. 1–4 are plots of normalized relaxation rates versus elapsed time obtained as described in Example 4.
Figure 2:
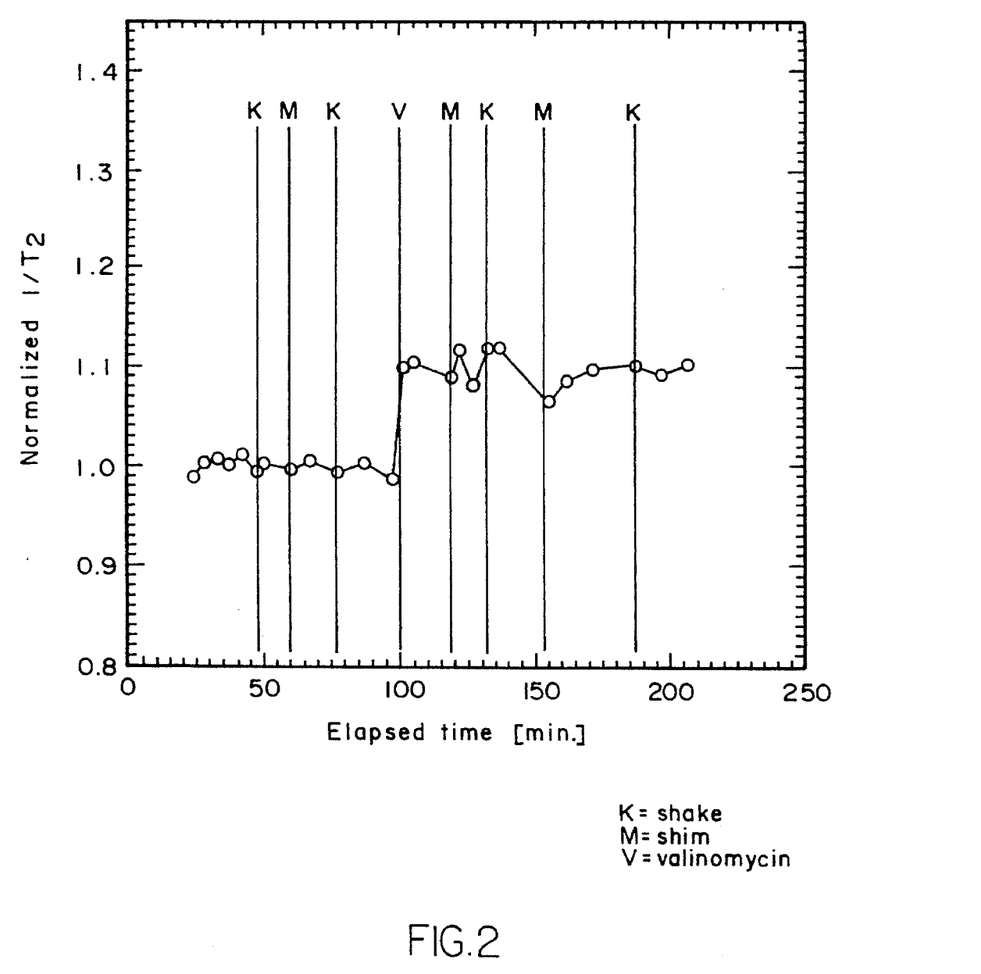
Figure 3:
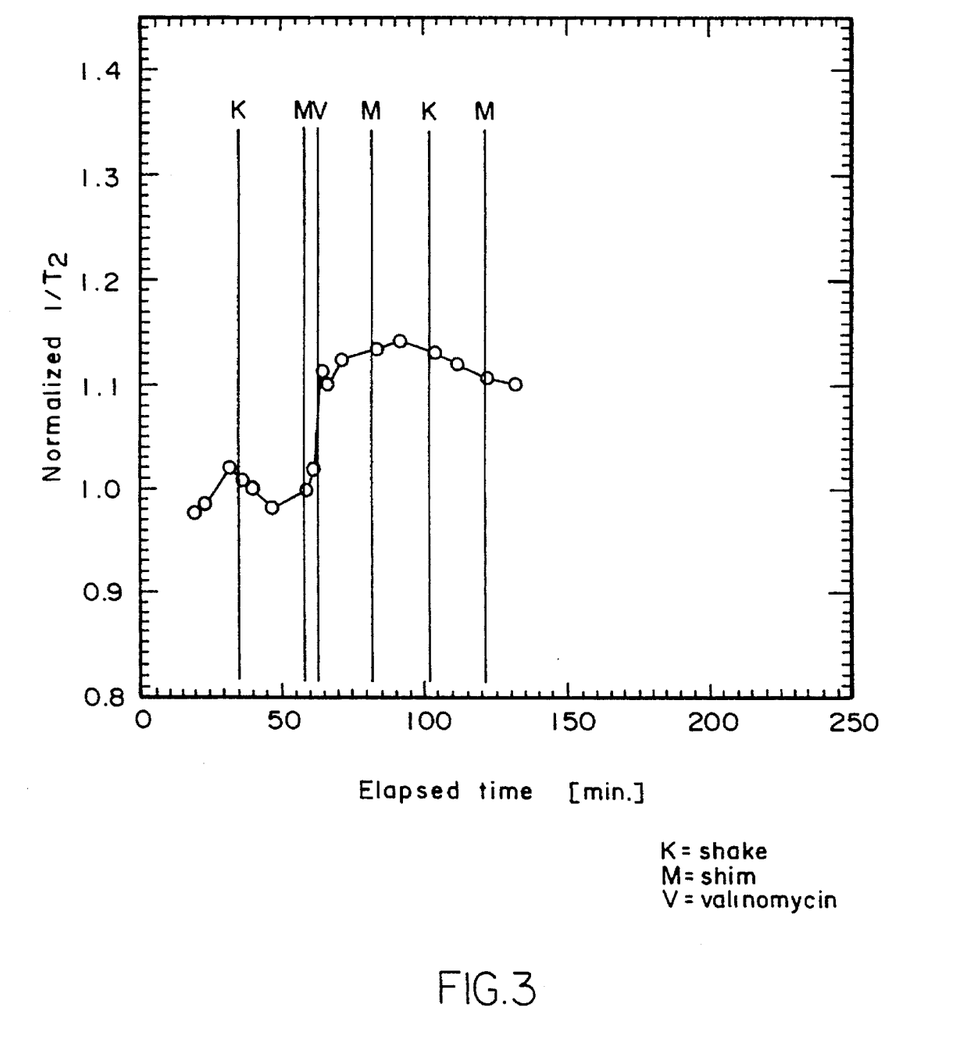

FIGS. 1, 2 and 3 depict the results of three repetitions of the same experiment that were carried out with a suspension of magnetic polyelectrolyte gel microparticles made in accordance with Example 1 with oleylamine as the connecting unit between the polymer and the superparamagnetic particles. These gel microparticles were homogenized, ultrasonicated and mixed with a vortex mixer to reduce their size. The addition of valinomycin (at point "V" in each Figure) clearly increased the transverse relaxation rate.

Figure 4:
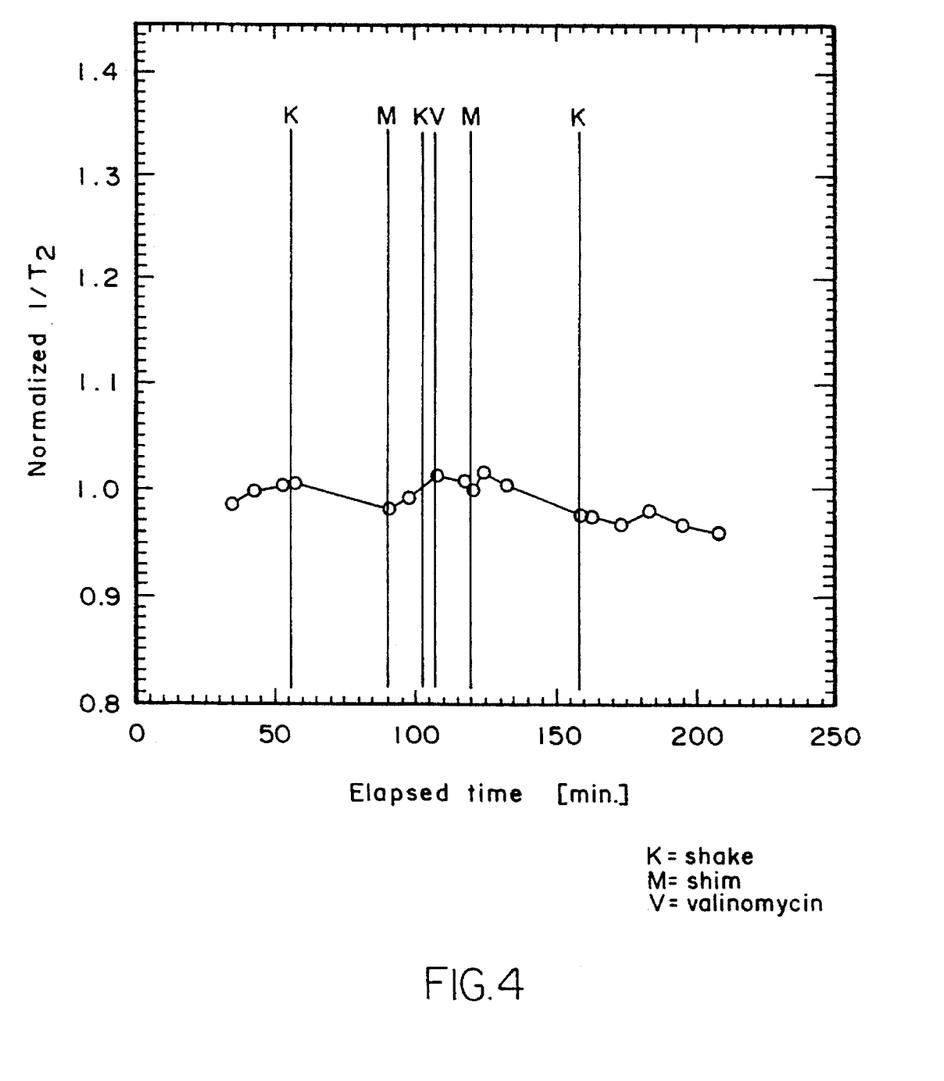

FIG. 4 depicts the results of a control experiment. The red blood cell suspension was similar to that used in the experiments described in FIGS. 1–3. The magnetic polyelectrolyte gel particles were also made with oleylamine as the connecting unit between the polymer and superparamagnetic particles. However, due to a defective monomer that was used in the synthesis of the magnetic polyelectrolyte gel, the preparations with this monomer produced non-functioning particles: these particles did not exhibit any volume phase transition in an electric field, neither in an electrochemical cell in the SISCO, nor under a microscope. They served as a good control since they are chemically similar to the particles used in arriving at FIGS. 1–3, but they do not shrink in an electric field and they exhibit no obvious effect upon addition of valinomycin.

The application of an electric field induces a volume phase transition in the magnetic polyelectrolyte gel microparticles and causes them to shrink, with an accompanying increase in the transverse relaxation rate. The addition of valinomycin to the red blood cells increases the magnitude of the electric field across their membrane from one that is very small to a considerable one.

If the microparticles were very close to the membrane of the red blood cells, the electric field that results from the hyperpolarization would be a plausible explanation for the increases in $1/T_2$ observed concomitantly. This could be the case if the red blood cells clung to the surface of the gel microparticles or if the cells were trapped inside the microparticles. The failure of the non-functioning particles to show a similar behavior supports this conclusion.

It can therefore be concluded that diagnostic agents in accordance with the present invention can detect changes in cellular membrane potential. It can also be concluded that the agents of the present invention would change the relaxation rate when the electric field changes in the vicinity of a neuron's membrane as a result of a change in the membrane potential. Neurons typically have intracellular sodium concentrations that are about one tenth of the extracellular sodium concentration while their intracellular potassium concentration is about ten times higher than the extracellular potassium concentration. Taking into account the difference in permeability of the membrane to sodium and potassium and their concentration gradients results in a difference of about 70 mV, at rest (by convention, the potential is measured against the exterior of the cell so the resting potential is about −70 mV). As Example 4 demonstrates, membrane potentials of about −66 mV can produce a change in the $T_2$ relaxation time detectable by MRI.

What is claimed is:

1. A method of imaging a human or non-human body or a selected region thereof, comprising:
   (a) administering to said body or region a diagnostically effective amount of a diagnostic agent, said diagnostic agent comprising a matrix whose specific volume undergoes a change from a first value to a second value in response to an electric field, said matrix further comprising a magnetic component distributed therethrough; and
   (b) generating a nuclear magnetic resonance image of said body or region by
      (i) applying an electric field sufficient to effect said specific volume change; and
      (ii) detecting said specific volume change in said matrix of said diagnostic agent.

2. The method of claim 1 wherein said diagnostic agent is administered parenterally.

3. The method of claim 1 wherein said diagnostic agent is administered gastrointestinally.

4. The method of claim 1 wherein said diagnostic agent is administered topically.

5. The method according to claim 1 wherein said matrix is polymeric.

6. The method according to claim 1 wherein said magnetic component is superparamagnetic.

7. The method according to claim 1 wherein said matrix is a polymeric polyelectrolyte gel.

8. The method according to claim 7 wherein said matrix is a copolymer.

9. The method according to claim 1 wherein said matrix is a copolymer of a monomer selected from the group consisting of acrylate, methacrylate, vinyl sulfonate, vinylsulfate, vinyl phosphate, vinyl phosphonate, styrene sulfonate, maleic acid, and butenoic acid.

10. The method according to claim 1 wherein said matrix is in the form of particles.

11. The method according to claim 10 wherein said particles are less than 1,000 microns in diameter.

12. The method according to claim 5 wherein said matrix is in the form of particles.

13. The method according to claim 12 wherein said particles are less than 1,000 microns in diameter.

14. The method according to claim 6 wherein said matrix is in the form of particles.

15. The method according to claim 14 wherein said particles are less than 1,000 microns in diameter.

16. The method according to claim 7 wherein said matrix is in the form of particles.

17. The method according to claim 16 wherein said particles are less than 1,000 microns in diameter.

18. The method according to claim 1 wherein said magnetic component is a component of a complex which is chemically bound into said matrix.

19. The method according to claim 1 wherein said magnetic component is physically bound or encased within said matrix.

20. The method according to claim 1 wherein said magnetic component is covalently bound into said matrix.

21. The method according to claim 6 wherein said superparamagnetic component comprises one or more elements selected from the group consisting of elements having atomic numbers 21–29, 42, 44 and 57–70, and cations thereof.

22. The method according to claim 21 wherein said superparamagnetic component comprises iron or a cation thereof.

23. The method according to claim 22 wherein said superparamagnetic component is physically bound or encased in a moiety which is covalently bound into said matrix.

24. The method according to claim 23 wherein said matrix is a copolymer of a monomer selected from the group consisting of acrylate, methacrylate, vinyl sulfonate, vinylsulfate, vinyl phosphate, vinyl phosphonate, styrene sulfonate, maleic acid, and butenoic acid.

25. The method according to claim 24 wherein said matrix is a copolymer one component of which is acrylate or methacrylate.

26. The method according to claim 25 wherein said matrix is in the form of particles.

27. A method of imaging cellular membrane potential in a region of a human or non-human body, comprising administering to said region a diagnostically effective amount of a diagnostic agent comprising a matrix whose specific volume undergoes a change from a first value to a second value in response to said potential, said matrix further comprising a magnetic component distributed therethrough; and generating a nuclear magnetic resonance image of said region by applying an electric field sufficient to effect said specific volume change and detecting said specific volume change in said matrix of said diagnostic agent.

28. A method of imaging neuronal membrane potential in a region of a human or non-human body, comprising administering to said region a diagnostically effective amount of a diagnostic agent comprising a matrix whose specific volume undergoes a change from a first value to a second value in response to said potential, said matrix further comprising a magnetic component distributed therethrough; and generating a nuclear magnetic resonance image of said region by applying an electric field sufficient to effect said specific volume change and detecting said specific volume change in said matrix of said diagnostic agent.

* * * * *